US00RE41866E

(19) United States
(12) Reissued Patent
Yano et al.

(10) Patent Number: US RE41,866 E
(45) Date of Reissued Patent: Oct. 26, 2010

(54) SEMICONDUCTOR DEVICE AND METHOD OF FABRICATING SAME

(75) Inventors: Mitsuhiro Yano, Fukuoka (JP); Kouichi Mochizuki, Fukuoka (JP)

(73) Assignee: Mitsubishi Denki Kabushiki Kaisha, Tokyo (JP)

(21) Appl. No.: 09/891,925

(22) Filed: Jun. 27, 2001

Related U.S. Patent Documents

Reissue of:
(64) Patent No.: 5,945,692
Issued: Aug. 31, 1999
Appl. No.: 08/432,812
Filed: May 2, 1995

(30) Foreign Application Priority Data

May 31, 1994 (JP) ..... 6-118386

(51) Int. Cl.
*H01L 29/74* (2006.01)
*H01L 31/111* (2006.01)
*H01L 29/76* (2006.01)

(52) U.S. Cl. ..... 257/139; 257/212; 257/401; 257/630; 257/646; 257/649; 257/409; 257/488; 257/E29.01; 257/E29.006

(58) Field of Classification Search ..... 257/139, 257/212, 341, 401, 630, 646, 649, 339, 409, 257/488–490, E29.01, E29.006
See application file for complete search history.

(56) References Cited

U.S. PATENT DOCUMENTS 4,161,744 A * 7/1979 Blaske et al. ..... 359/59
4,364,073 A * 12/1982 Becke et al. ..... 357/23
4,798,810 A 1/1989 Blanchard et al.
4,814,283 A * 3/1989 Temple et al. ..... 437/8
5,196,354 A * 3/1993 Ohtaka et al. ..... 437/17
5,521,409 A * 5/1996 Hshieh et al. ..... 257/341

FOREIGN PATENT DOCUMENTS

| | | |
|---|---|---|
| EP | 0 091 079 | 10/1983 |
| JP | 62-073766 | 4/1987 |
| JP | 62-213167 | 9/1987 |
| JP | 1-265524 | 10/1989 |
| JP | 02-153570 | 6/1990 |
| JP | 4-57330 | 2/1992 |
| JP | 4-130631 | 5/1992 |
| JP | 04-212468 | 8/1992 |
| JP | 6-140633 | 5/1994 |

OTHER PUBLICATIONS

Richard W. Coen, et al., "A High–Performance Planar Power MOSFET", IEEE Transactions on Electron Devices, vol. ED–27, No. 2, Feb. 1980, pp. 340–343.
Patent Abstracts of Japan, vol. 14, No. 408 (E–972) (4351), Sep. 4, 1990, and JP 2 153570, Jun. 13, 1990.
IEEE Transactions on Electron Devices, vol. ED–27, No. 2, pp. 340–343, Feb. 1980, Richard W. Coen, et al., "A High–Performance Planar Power Mosfet".
Patent Abstracts of Japan vol. 11, No. 275 (E–537) (2722), Sep. 5, 1987, and JP 62 73766, Apr. 4, 1987.
Patent Abstracts of Japan, vol. 16, No. 558 (E–1294), Nov. 27, 1992, and JP 4 212468, Aug. 4, 1992.

* cited by examiner

*Primary Examiner*—Shouxiang Hu
(74) *Attorney, Agent, or Firm*—Oblon, Spivak, McClelland, Maier & Neustadt, L.L.P.

(57) ABSTRACT

There is disclosed a semiconductor device having an MOS gate for reducing variations in threshold voltage ($V_{th}$) with time wherein a surface protective film is not formed in a device area including channels but only in a device peripheral area, thereby reducing the amount of hydrogen atoms migrating to a silicon-silicon oxide interface in a cell area and, accordingly, reducing the number of Si—H chemical bonds at the interface.

22 Claims, 11 Drawing Sheets

(BT CONDITIONS : 200°C.5 MINUTES. 25 V/μm)

SEMICONDUCTOR DEVICE AND METHOD OF FABRICATING SAME

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a semiconductor device and a method of fabricating the same. More particularly, the invention relates to a device structure for reducing variations in threshold voltage $V_{th}$ of a power semiconductor device having an MOS gate with time to stabilize electrical characteristics, and a method of fabricating the same.

2. Description of the Background Art

FIG. 19 is a fragmentary plan view of a power insulated gate bipolar transistor (referred to hereinafter as an IGBT) as an example of the conventional semiconductor devices. FIG. 20 is a cross-sectional view taken along the line XX—XX of FIG. 19.

In FIGS. 19 and 20, the reference numeral 1 designates a $P^+$ substrate; 2 designates an $N^+$ layer; 3 designates an $N^-$ layer; and 4 designates a semiconductor body comprised of the $P^+$ substrate 1 the $N^+$ layer 2 and the $N^-$ layer 3.

The reference numeral 5 designates a $P^+$ base layer; 6 designates an $N^+$ emitter layer; 7 designates a gate insulating film made of silicon oxide; 8 designates a gate electrode of polysilicon; 9 designates a gate interconnection line of Al; 10 designates an emitter electrode; 11 designates guard rings; 12 designates a passivation film for isolation between the gate electrode 8 and the emitter electrode 10; 13 designates an emitter wire bonding region; 14 designates a surface protective film of silicon nitride for covering the IGBT surface except the emitter wiring bonding region 13 and a gate bonding pad (not shown) which is a part of the gate interconnection line [8] *9*; 15 designates a channel stopper; 16 designates a silicon oxide film; 17 designates a polysilicon film; 18 designates a passivation film; and 19 designates a collector electrode.

FIG. 21 is a flow chart of the fabrication process of the conventional IGBT.

Referring to FIG. 21, the semiconductor body 4 is initially formed, and the $P^+$ base layer 5, and P wells, $P^+$ layers serving as the guard rings 11 are formed in the surface of the $N^-$ layer 3 of the semiconductor body 4. The gate insulating film 7 of silicon oxide is formed on the surface of the $P^+$ base layer 5, and a polysilicon film is formed on the surface of the gate insulating film 7. Then the $N^+$ emitter layer 6 and the channel stopper 15 are formed by diffusion, and the passivation films 12 and [17] *18* are formed. The gate interconnection line 9 and the emitter electrode 10 are formed as Al electrodes. Thereafter, the surface protective film 14 is formed to cover the IGBT surface except the emitter wire bonding region 13 and the gate bonding pad which is a part of the gate interconnection line 9. A silicon nitride film serving as the surface protective film 14 is formed by plasma CVD process (referred to hereinafter as P-CVD process) at a temperature of about 300 to 400° C. in an atmosphere of a mixed silane-ammonia gas. Then the IGBT is exposed to radiation for lifetime control thereof and is subjected to heat treatment at a temperature of 300 to 400° C. to eliminate distortion resulting from the radiation.

The surface protective film 14 is formed for the following purposes: (1) to prevent shorting of the emitter electrode 10 and gate interconnection line due to mechanical scratches, (2) to prevent shorting of an aluminum electrode (not shown) formed on the guard rings 11 in a peripheral area of a chip due to external contamination, and (3) to prevent moisture from corroding aluminum thin wires of The device.

In the past, oxide films formed by the low pressure CVD process (referred to hereinafter as LP-CVD process), such as phospho-silicate glass (PSG), have been used as the surface protective film of the IGBT. However, silicon nitride films formed by the P-CVD process have recently been used as the surface protective film since the material of the silicon nitride films is more air-tight and mechanically stronger as a surface protective film than that of the PSG films. In this manner, the conventional IGBT is constructed as above described using the silicon nitride film formed by the P-CVD process as the surface protective film and is fabricated through the above-mentioned fabrication process.

To evaluate the long-term stability of electrical characteristics of the IGBT, a HTGB test (high temperature gate bias test) was performed. The HTGB test is to continuously apply a gate signal $V_{GES}$≈+20 V or −20 V between the gate and emitter, with the emitter and collector grounded, at an atmospheric temperature $T_a$=125° C. to determine the relation between a $V_{GES}$ voltage application time and variations in threshold voltage $V_{th}$ with time.

FIG. 22 is a graph of the result of the HTGB test made on the conventional semiconductor devices.

The test conditions in FIG. 22 are an atmospheric temperature Ta≈125° C. and $V_{GES}$=±20 V for an IGBT, and an atmospheric temperature Ta=150° C. and $V_{GES}$=−30 V for an MOSFET. Variations in threshold voltage $V_{th}$ is represented by the percentage of $V_{th}$ variations.

The MOSFET used herein is constructed such that the $P^+$ substrate is removed from the structure of FIG. 20 and the $N^+$ layer 2 is replaced with an $N^+$ substrate. The fabrication process of the MOSFET does not include the radiation and the heat treatment for distortion elimination of FIG. 21.

Referring to FIG. 22, for the IGBT, with $V_{GES}$=+20 V applied, the $V_{th}$ variation percentage is several percent which presents no particular problems in terms of long-term stability of the electrical characteristics. For the IGBT, with $V_{GES}$=−20 V applied, $V_{th}$ decreases with the passage of the $V_{GES}$ application time, and the $V_{th}$ variation percentage exceeds 10% after an elapse of 1000 hours. In addition, the $V_{th}$ variation does not tend to become saturated over 1000 hours. Thus, the conventional IGBT has been disadvantageous in long-term stability of the electrical characteristics.

For the conventional MOSFET, with $V_{GES}$=−30 V applied, $V_{th}$ decreases with the passage of the $V_{GES}$ application time and tends to become saturated after an elapse of 500 hours, as compared with the IGBT. However, the MOSFET exhibits the $V_{th}$ variation percentage reaching 10%. Thus, the conventional MOSFET has been disadvantageous in long-term stability of the electrical characteristics.

The application of a negative voltage $V_{GES}$ varies the threshold voltage $V_{th}$ which in turn is slow in becoming saturated, possibly for the reasons to be described below.

The silicon nitride film formed by the P-CVD process contains a large amount of hydrogen atoms. For example, the number of Si—H chemical bonds in the silicon nitride film formed by the P-CVD process is $1.0\times10^{22}$ $cm^{-3}$ to $1.6\times10^{22}$ $cm^{-3}$ by measurement using FT-IR (Fourier transform infrared spectroscopy) technique. The number of Si—H chemical bonds in the PSG film is on the order of $0.4\times10^{22}$ $cm^{-3}$. The hydrogen atoms in the silicon nitride film readily migrate through the surface protective film 14 of silicon nitride, the aluminum electrodes such as the gate interconnection line 9 and emitter electrode 10, the passivation film [17] *12* and the gate insulating film 7 of silicon oxide depending upon the atmospheric temperatures and the polarity and magnitude of the applied voltage to reach a silicon-silicon oxide interface at the surface of the semiconductor body 4 without difficulty. Dangling bonds at the silicon-silicon oxide interface are bonded to hydrogen atoms from the silicon nitride film to form Si—H chemical bonds at the silicon-silicon oxide interface, resulting in an unstable interface state. It takes time to stabilize the interface state, which is considered to cause the difficulty in saturating the varying threshold voltage $V_{th}$.

One of the reasons why such a problem is not encountered for the conventional PSG film is considered to be the fact that the PSG film contains fewer Si—H chemical bonds and, accordingly, fewer hydrogen atoms than the silicon nitride film formed by the P-CVD process.

Further, the radiation for lifetime control of the IGBT increases the defects at the silicon-silicon oxide interface to accelerate the formation of Si—H bonds at the silicon-silicon oxide interface, probably resulting in increased $V_{th}$ variations with time.

SUMMARY OF THE INVENTION

According to the present invention, a semiconductor device comprises: a first semiconductor layer of a first conductivity type having first and second major surfaces; a first semiconductor region of a second conductivity type formed selectively in the first major surface of the first semiconductor layer so that the first semiconductor layer is exposed in a peripheral portion of the first major surface and the first semiconductor layer is exposed in the form of insular regions in a central portion of the first major surface; a second semiconductor region of the first conductivity type formed in a surface of the first semiconductor region, with channel regions provided between the second semiconductor region and the insular regions of the first semiconductor layer; a gate insulating film formed on a surface of the channel regions; a gate formed on the gate insulating film; a first main electrode formed over a surface of the gate, with an interlayer insulating film therebetween, for covering a surface of the second semiconductor region and electrically connected to the second semiconductor region, the first main electrode having an end extending to a boundary between the peripheral portion of the first major surface and the central portion thereof; a second main electrode formed on the second major surface of the first semiconductor layer; and an integral surface protective film for covering at least the peripheral portion of the first major surface other than the central portion of the first major surface.

In the semiconductor device of the present invention, the surface protective film is formed only in the peripheral area of the device, not in the device area including the channels, to reduce the amount of hydrogen atoms migrating to the silicon-silicon oxide interface in the cell area, enhancing the electrical stability of the semiconductor device.

Preferably, the semiconductor device further comprises: a gate interconnection line formed selectively on the surface of the gate, wherein the first main electrode is not formed on the surface of the gate on which the gate interconnection line is formed, and wherein a trench is formed between the first main electrode and the gate interconnection line for electrical isolation therebetween.

The provision of the gate interconnection line stabilizes the gate potential and the cell switching operation of the semiconductor device.

Preferably, the surface protective film extends from a surface of the gate interconnection line through the trench to the surface of the first main electrode.

The provision of the surface protective film covering the trench electrically isolating the gate interconnection line and the first main electrode from each other prevents shorting of the gate interconnection line and the first main electrode, increasing a product yield.

According to another aspect of the present invention, a semiconductor device comprises: a first semiconductor layer of a first conductivity type having first and second major surfaces; a first semiconductor region of a second conductivity type formed selectively in the first major surface of the first semiconductor layer so that the first semiconductor layer is exposed in a peripheral portion of the first major surface and the first semiconductor layer is exposed in the form of insular regions in a central portion of the first major surface; a plurality of second semiconductor regions of the first conductivity type formed in a surface of the first semiconductor region, with channel regions provided between the second semiconductor regions and the insular regions of the first semiconductor layer; a gate insulating film formed on a surface of the channel regions; a gate formed on the gate insulating film; a first main electrode formed over a surface of the gate, with an interlayer insulating film therebetween, for covering surfaces of the second semiconductor regions and electrically connected to the second semiconductor regions, the first main electrode having an end extending to a boundary between the peripheral portion of the first major surface and the central portion thereof; a second main electrode formed on the second major surface of the first semiconductor layer; and an integral surface protective film for covering at least the peripheral portion of the first major surface other than the central portion of the first major surface.

In the semiconductor device of the second aspect of the present invention, the plurality of cells increases the device capacitance. The surface protective film is formed only in the peripheral area of the device, not in the device area including the channels, to reduce the amount of hydrogen atoms migrating to the silicon-silicon oxide interface in the cell area, enhancing the electrical stability of the large-capacitance semiconductor device.

Preferably, the surface protective film extends from the peripheral portion of the first major surface to a surface of the first main electrode at the end.

Since the gate interconnection line is formed to connect portions of the gate electrode corresponding to the plurality of channels, the semiconductor device of the present invention provides a stable gate potential if the entire length of the gate interconnection line may increase. This provides a uniform cell switching operation for the large-capacitance semiconductor device and a stable operation of the whole semiconductor device.

Preferably, the semiconductor device further comprises: a gate interconnection line formed selectively on the surface of the gate, wherein the first main electrode is not formed on the surface of the gate on which the gate interconnection line is formed, and wherein a trench is formed between the first main electrode and the gate interconnection line for electrical isolation therebetween.

The provision of the surface protective film covering the trench electrically isolating the first main electrode and the gate interconnection line connecting the portions of the gate electrode corresponding to the plurality of channels from each other prevents shorting of the gate interconnection line and the first main electrode if the trench for electrically isolating the gate interconnection line and the first main electrode may be long, increasing the product yield of the large-capacitance semiconductor device.

Preferably, the semiconductor device further comprises: a second semiconductor layer of the second conductivity type formed between said second major surface of said first semiconductor layer and said second main electrode.

In the semiconductor device of the present invention, the surface protective film is formed only in the peripheral area of the device, not in the device area including the channels, in an IGBT construction to reduce the amount of hydrogen atoms migrating to the silicon-silicon oxide interface in the cell area, enhancing the electrical stability of the semiconductor device of the IGBT construction.

Preferably, the semiconductor device further comprises: a gate interconnection line formed selectively on the surface of said gate, wherein said first main electrode is not formed on the surface of said gate on which said gate interconnection line is formed, and wherein a trench is formed between the first main electrode and said gate interconnection line for electrical isolation therebetween.

The provision of the gate interconnection line in the IGBT construction stabilizes the gate potential and the cell switching operation of the semiconductor device of the IGBT construction.

Preferably, said surface protective film extends from a surface of said gate interconnection line through said trench to the surface of said first main electrode.

The provision of the surface protective film covering the trench electrically isolating the gate interconnection line and the first main electrode from each other in the IGBT construction prevents shorting of the gate interconnection line and the first main electrode, increasing the product yield of the semiconductor device of the IGBT construction.

Preferably, the semiconductor device further comprises: a second semiconductor layer of the second conductivity type formed between the second major surface of the first semiconductor layer and the second main electrode.

The plurality of cells in the IGBT construction increases the device capacitance. The surface protective film is formed only in the peripheral area of the device, not in the device area including the channels, to reduce the amount of hydrogen atoms migrating to the silicon-silicon oxide interface in the cell area, enhancing the electrical stability of the largest-capacitance semiconductor device of the IGBT construction.

Preferably, the semiconductor device further comprises: a gate interconnection line formed selectively on the surface of the gate, wherein the first main electrode is not formed on the surface of the gate on which the gate interconnection line is formed, and wherein a trench is formed between the first main electrode and the gate interconnection line for electrical isolation therebetween.

Since the gate interconnection line is formed to connect portions of the gate electrode corresponding to the plurality of channels in the IGBT construction, the semiconductor device of the present invention provides a stable gate potential if the entire length of the gate interconnection line may increase. This provides a uniform cell switching operation for the large-capacitance semiconductor device of the IGBT construction and a stable operation of the whole semiconductor device.

Preferably, the surface protective film extends from a surface of the gate interconnection line through the trench to the surface of the first main electrode.

The provision of the surface protective film covering the trench electrically isolating the first main electrode and the gate interconnection line connecting the portions of the gate electrode corresponding to the plurality of channels from each other in the IGBT construction prevents shorting of the gate interconnection line and the first main electrode if the trench for electrically isolating the gate interconnection line and the first main electrode may be long, increasing the product yield of the large-capacitance semiconductor device of the IGBT construction.

Preferably, the surface protective film is a semi-insulation film having a conductivity ranging from $1\times10^{-14}$ to $1\times10^{-10}$ (1/Ωcm).

Preferably, the surface protective film is a semi-insulation film having a conductivity ranging from $1\times10^{-13}$ to $1\times10^{-11}$ (1/Ωcm).

Since the surface protective film is a semi-insulation film, an electric field shield effect generated in the surface protective film provides a shield against electrical charges such as externally deposited impurity ions to prevent the decrease in breakdown voltage of the semiconductor device due to external contamination, achieving a high breakdown voltage. In addition, the degree of freedom of designing the semiconductor device and the product yield of the semiconductor device are increased.

Preferably, the surface protective film is a nitride film.

The surface protective film which is a semi-insulation nitride film increases the breakdown voltage characteristic and easily controls the resistance of the surface protective film in fabrication of the semiconductor device, increasing the product yield of the semiconductor device.

The present invention is also intended for a method of fabricating a semiconductor device. According to the present invention, the method comprises the steps of: forming a first semiconductor layer of a first conductivity type having first and second major surfaces on a second semiconductor layer of a second conductivity type having first and second major surfaces such that the second major surface of the first semiconductor layer contacts the first major surface of the second semiconductor layer, to form a semiconductor body; selectively forming a first semiconductor region of the second conductivity type in the first major surface of the first semiconductor layer so that the first semiconductor layer is exposed in a peripheral portion of the first major surface of the first semiconductor layer and the first semiconductor layer is exposed in the form of insular regions in a central portion of the first major surface of the first semiconductor layer; forming a second semiconductor region of the first conductivity type in a surface of the first semiconductor region, with channel regions provided between the second semiconductor region and the insular regions of the first semiconductor layer in the surface of the first semiconductor region; forming a gate insulating film on a surface of the channel regions; forming a gate on the gate insulating film; forming an interlayer insulating film on a surface of the gate; forming a first main electrode covering a surface of the second semiconductor region, with the interlayer insulating film therebetween, and electrically connected to the second semiconductor region, the first main electrode being formed such that an end of the first main electrode extends to a boundary between the peripheral portion of the first major surface of the first semiconductor layer and the central portion thereof; performing radiation for lifetime control; performing heat treatment for eliminating distortion; integrally forming a surface protective film at least over the peripheral portion of the first major surface of the first semiconductor layer other than the central portion thereof after the steps of performing radiation and performing heat treatment; and forming a second main electrode on the second major surface of the second semiconductor layer.

In the method according to the present invention, the surface protective film is integrally formed at least over the peripheral portion of the first major surface of the first semiconductor layer other than the central portion of the first main electrode after the high-energy radiation for lifetime control and the heat treatment for distortion elimination. Since the surface protective film is formed after reduction in defects at the silicon-silicon oxide interface generated by the radiation, the amount of hydrogen atoms migrating to the cell area and the bonds of hydrogen atoms to the dangling bonds are reduced, whereby an electrically highly reliable semiconductor device is readily fabricated.

According to another aspect of the present invention, a method of fabricating a semiconductor device, comprises the steps of: forming a first semiconductor layer of a first conductivity type having first and second major surfaces on a second semiconductor layer of a second conductivity type having first and second major surfaces such that the second major surface of the first semiconductor layer contacts the first major surface of the second semiconductor layer, to form a semiconductor body; selectively forming a first semiconductor region of the second conductivity type in the first major surface of the first semiconductor layer so that the first semiconductor layer is exposed in a peripheral portion of the first major surface of the first semiconductor layer and the first semiconductor layer is exposed in the form of insular regions in a central portion of the first major surface of the first semiconductor layer; forming a second semiconductor region of the first conductivity type in a surface of the first semiconductor region, with channel regions provided between the second semiconductor region and the insular regions of the first semiconductor layer in the surface of the first semiconductor region; forming a gate insulating film on a surface of the channel regions; forming a gate on the gate insulating film; forming an interlayer insulating film on a surface of the gate; selectively forming a gate interconnection line on the surface of the gate; forming a first main electrode having a trench electrically insulating the first main electrode and the gate interconnection line for covering a surface of the second semiconductor region, with the interlayer insulating film therebetween, and electrically connected to the second semiconductor region, the first main electrode being formed such that an end of the first main electrode extends to a boundary between the peripheral portion of the first major surface of the first semiconductor layer and the central portion thereof; performing radiation for lifetime control; performing heat treatment for eliminating distortion; integrally forming a surface protective film over the entire top surface except a part of a surface of the first main electrode and a part of a surface of the gate interconnection line; and forming a second main electrode on the second major surface of the second semiconductor layer.

In this method according to the present invention, the surface protective film is integrally formed over the surface of the first main electrode except the part of the first main electrode and the part of the gate interconnection line after the high-energy radiation for lifetime control and the heat treatment for distortion elimination. Since the surface protective film is formed after reduction in defects at the silicon-silicon oxide interface generated by the radiation, the bonds of hydrogen atoms to the dangling bonds are reduced, with the conventional structure, whereby an electrically highly reliable semiconductor device is readily fabricated.

According to still another aspect of the present invention, a method of fabricating a semiconductor device, comprises the steps of: forming a first semiconductor layer of a first conductivity type having first and second major surfaces on a second semiconductor layer of a second conductivity type having first and second major surfaces such that the second major surface of the first semiconductor layer contacts the first major surface of the second semiconductor layer, to form a semiconductor body; selectively forming a first semiconductor region of the second conductivity type in the first major surface of the first semiconductor layer so that the first semiconductor layer is exposed in a peripheral portion of the first major surface of the first semiconductor layer and the first semiconductor layer is exposed in the form of insular regions in a central portion of the first major surface of the first semiconductor layer; forming a second semiconductor region of the first conductivity type in a surface of the first semiconductor region, with channel regions provided between the second semiconductor region and the insular regions of the first semiconductor layer in the surface of the first semiconductor region; forming a gate insulating film on a surface of the channel regions; forming a gate on the gate insulating film; forming an interlayer insulating film on a surface of the gate; selectively forming a gate interconnection line on the surface of the gate; forming a first main electrode having a trench electrically insulating the first main electrode and the gate interconnection line for covering a surface of the second semiconductor region, with the interlayer insulating film therebetween, and electrically connected to the second semiconductor region, the first main electrode being formed such that an end of the first main electrode extends to a boundary between the peripheral portion of the first major surface of the first semiconductor layer and the central portion thereof; performing radiation for lifetime control; performing heat treatment for eliminating distortion; integrally forming a surface protective film at least over the peripheral portion of the first major surface of the first semiconductor layer and extending from a surface of the gate interconnection line through the trench to a surface of the first main electrode after the steps of performing radiation and performing heat treatment; and forming a second main electrode on the second major surface of the second semiconductor layer.

In this method according to the present invention, the surface protective film is integrally formed over the peripheral portion of the first main electrode and extending from the surface of the gate interconnection line through the trench to the surface of the first main electrode after the high-energy radiation for lifetime control and the heat treatment for distortion elimination. Since the surface protective film is formed after reduction in defects at the silicon-silicon oxide interface generated by the radiation, the amount of hydrogen atoms migrating to the cell area and the bonds of hydrogen atoms to the dangling bonds are reduced, whereby an electrically highly reliable semiconductor device is readily fabricated.

It is an object of the present invention to provide a semiconductor device having an MOS gate for reducing variations in threshold voltage $V_{th}$ with time to stabilize electrical characteristics thereof, and a method of fabricating the same.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
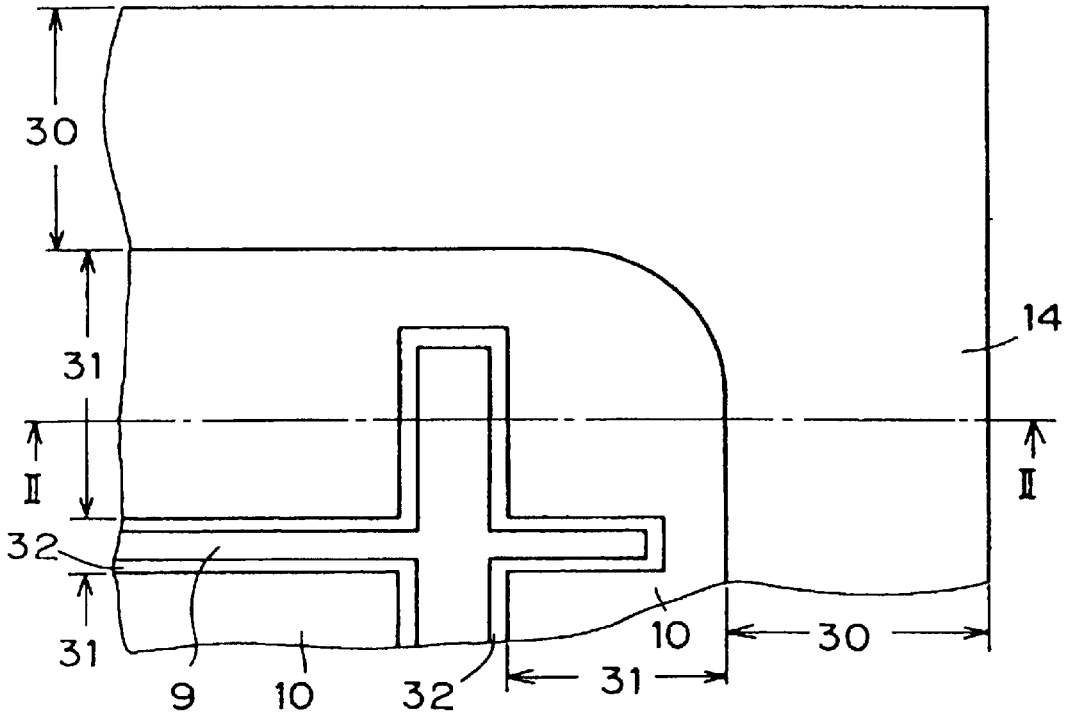
FIG. 1 is a fragmentary plan view of a power IGBT according to a first preferred embodiment of the present invention.
Figure 2:
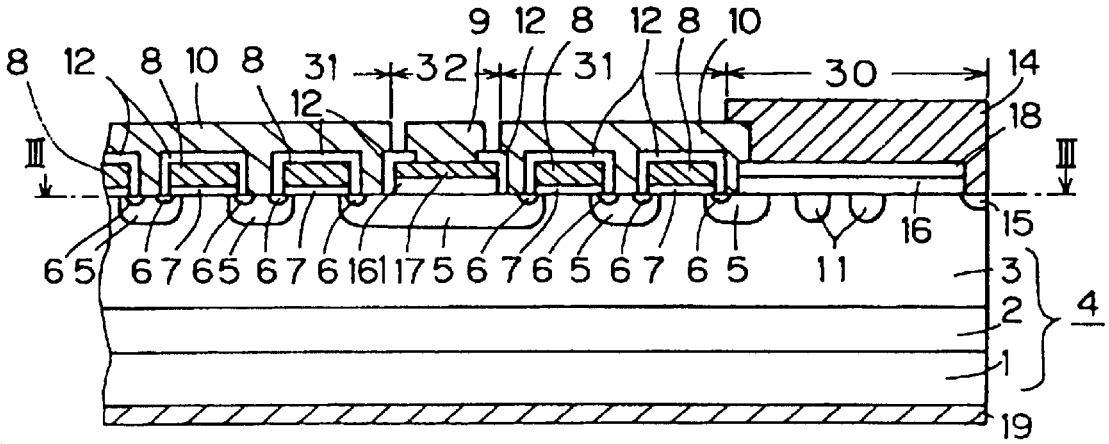
FIG. 2 is a fragmentary cross-sectional view taken along the line II—II of FIG. 1.
Figure 3:
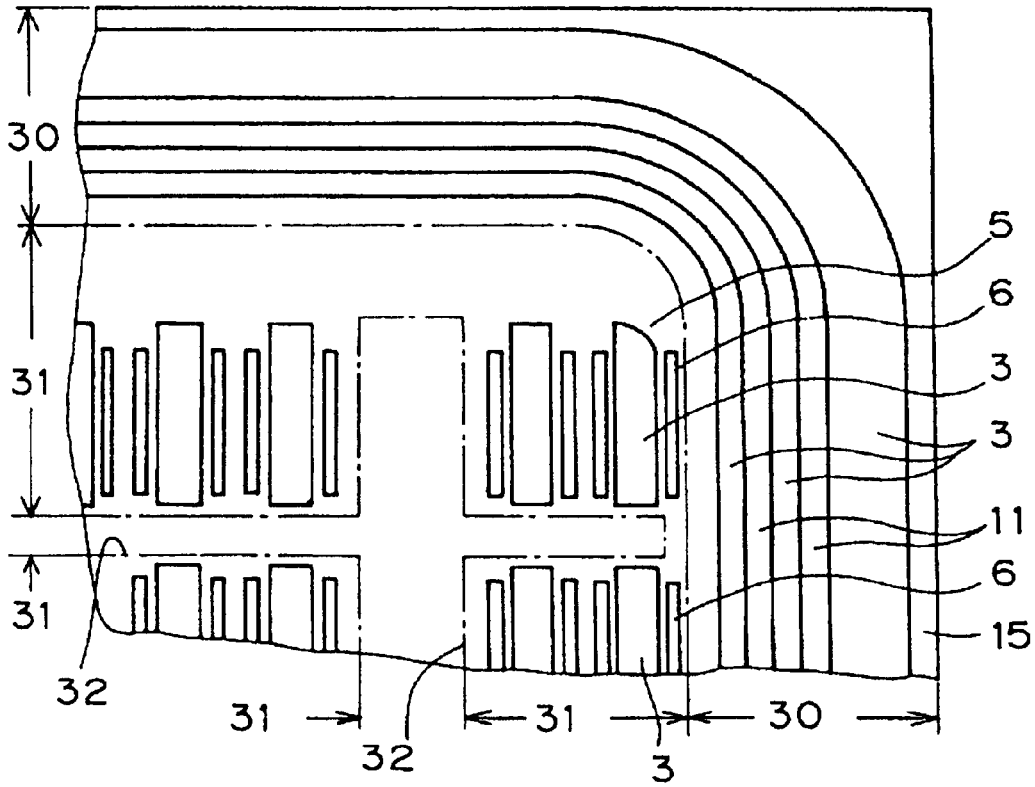
FIG. 3 is a fragmentary plan view taken along the line III—III of FIG. 2 at the surface of a semiconductor body.
Figure 4:
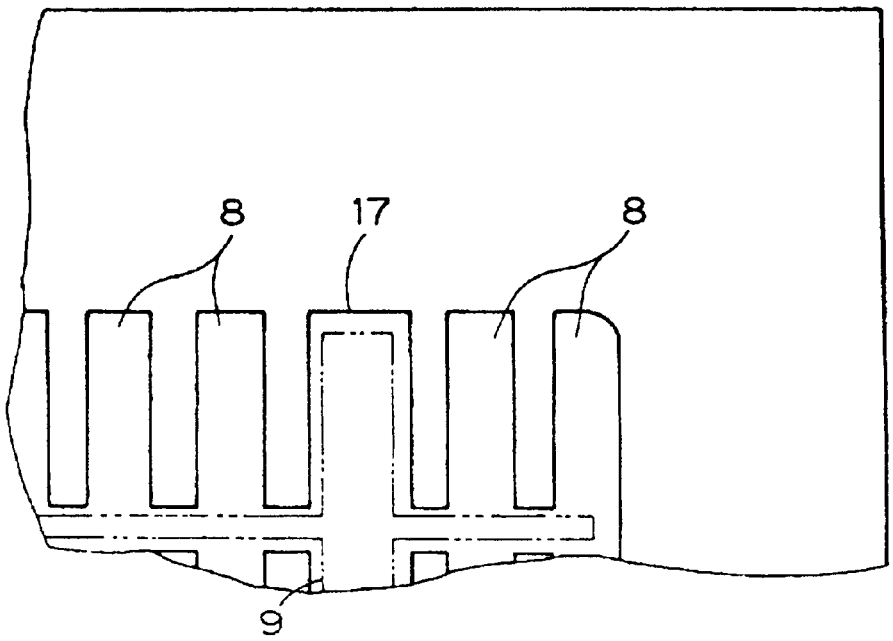
FIG. 4 is a fragmentary plan view illustrating a plan configuration of a gate electrode of FIG. 1.

FIG. 1 is a fragmentary plan view of a power IGBT according to a first preferred embodiment of the present invention. FIG. 2 is a fragmentary cross-sectional view taken along the line II—II of FIG. 1. FIG. 3 is a fragmentary plan view taken along the line III—III of FIG. 2 at the surface of a semiconductor body. FIG. 4 is a fragmentary plan view illustrating a plan configuration of a gate electrode shown in FIG. 1. In the fragmentary plan view of the gate electrode in FIG. 4, only the gate electrode and portions formed simultaneously with the gate electrode are illustrated and other portions are not illustrated.

In FIGS. 1 and 2, the reference numeral 1 designates a $P^+$ substrate serving as a second semiconductor layer; 2 designates an $N^+$ layer; 3 designates an $N^-$ layer. The $N^+$ layer 2 and the $N^-$ layer 3 form a first semiconductor layer. The reference numeral 4 designates a semiconductor body comprised of the $P^+$ substrate 1, the $N^+$ layer and the $N^-$ layer 3; 5 designates a $P^+$ base layer serving as a first semiconductor region; 6 designates an $N^+$ emitter layer serving as a second semiconductor region; 7 designates a gate insulating film of silicon oxide; 8 designates a gate electrode of polysilicon serving as a gate; 9 designates a gate interconnection line of Al; 10 designates an emitter electrode of Al serving as a first main electrode; 11 designates guard rings which are $P^+$ diffusion regions; 12 designates a passivation film of PSG serving as an interlayer insulating film for isolation between the gate electrode 8 and the emitter electrode 10; 14 designates a surface protective film which is a semi-insulation film of silicon nitride for covering a peripheral area surface of the IGBT; 15 designates a channel stopper; 16 [designates] *and 161 designate* a silicon oxide film; 17 designates a polysilicon film; 18 designates a passivation film; and 19 designates a collector electrode serving as a second main electrode.

Referring to FIG. 3, the $N^-$ layer 3 is exposed in the form of insular regions on the surface of a central portion of the device, and the $P^+$ base layer 5 covers the surface except the insular regions of the $N^-$ layer 3. The $N^+$ emitter layer 6 is formed in the $P^+$ base layer 5, with narrow portions of the $P^+$ base layer 5 sandwiched between the $N^+$ emitter layer 6 and the insular regions of the $N^-$ layer 3. The narrow portions of the $P^+$ base layer 5 between the insular regions of the $N^-$ layer 3 and the $N^+$ emitter layer 6 serve as channel regions. The gate insulating film 7 on the surface of the channel region is formed integrally over the plurality of channel regions. The integral gate electrode 8 of substantially the same configuration as the gate insulating film 7 is formed on the surface of the integral gate insulating film 7, as shown in FIG. 4.

As the number of channels opposed to the gate electrode 8 increases, gate potentials opposed to the respective channels are not necessarily uniform in the gate electrode 8. To provide uniform gate potentials, the gate interconnection line 9 of aluminum is provided to connect the portions of the gate electrode 8 opposed to the respective channels (FIGS. 1 and 2). The gate interconnection line 9 extends to the center of the device and is connected to a gate bonding pad (not shown) in the center of the device. Connection lines to the exterior are bonded to the gate bonding pad. An area in which the gate interconnection line 9 and the bonding pad are provided is a gate wiring area 32.

The emitter electrode 10 is formed on the surface of the gate electrode 8 except the portion where the gate interconnection line 9 is formed, with the passivation film 12 formed therebetween. The emitter electrode 10 short-circuits the $P^+$ base layer 5 and the $N^+$ emitter layer 6 on the surface of the semiconductor body 4 and is electrically isolated from the gate interconnection line 9 by a trench. An area in which the emitter electrode 10 is formed is a cell area 31 (FIGS. 1 and 2).

The $N^-$ layer 3 is exposed in a peripheral portion surrounding the surface of the semiconductor body 4. The peripheral portion generally corresponds to a device peripheral area 30 on the surface of the semiconductor body 4 other than the gate wiring area 32 and the cell area 31.

The plurality of annular guard rings 11 are formed in the $N^-$ layer 3 in the peripheral portion to surround the outer periphery of the cell area 31. The channel stopper 15 which is an $N^+$ diffusion region is formed on the outermost edge of the $N^-$ layer 3 in the peripheral portion to surround the guard rings 11. The inner periphery of the channel stopper 15 is adapted such that the channel stopper 15 are generally equally spaced from the outermost guard ring 11 over the entire circumference. The surface protective film 14 which is a semi-insulation film of silicon nitride directly covers the surface of the channel stopper 15, and covers the surfaces of the $N^-$ layer 3 in the peripheral portion and the outer peripheral portion of the $P^+$ base layer 5, with the silicon oxide film 16 and passivation film 18 formed therebetween. The surface protective film 14 is integrally formed such that an inner peripheral end thereof overlapping and covering the outer peripheral portion of the emitter electrode 10 and an outer peripheral end thereof extends to the outer end of the channel stopper 15 to prevent the surface of the passivation film 18 from being exposed. An area in which the surface protective film 14 is formed is the device peripheral area 30.

An MOSFET is similar in construction to the IGBT except that the MOSFET does not include the $P^+$ substrate 1 of the IGBT. That is, the MOSFET is constructed such that the $P^+$ substrate 1 of the IGBT is removed and the $N^+$ layer 2 of the IGBT is replaced with an $N^+$ substrate on which a drain electrode is formed.

A method of fabricating a semiconductor device will now be described hereinafter.

Figure 5:
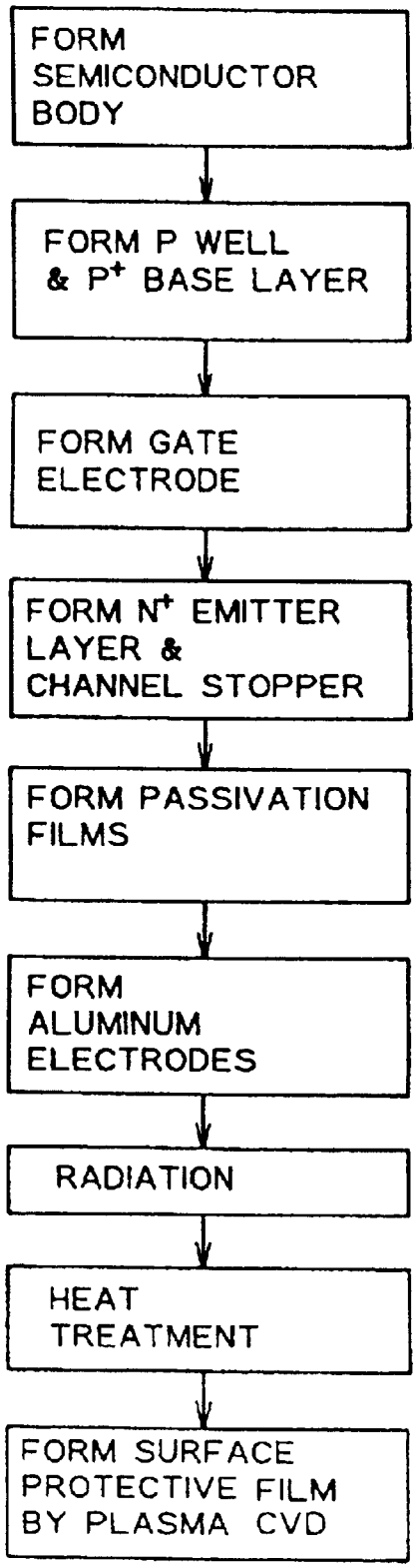
FIG. 5 is a flow chart of fabrication process of the semiconductor device according to the present invention.

FIG. 5 is a flow chart of the fabrication process of an IGBT as an example of the semiconductor device of the present invention. FIGS. 6 to 12 are cross-sectional views illustrating the fabrication process of the IGBT.

Figure 6:
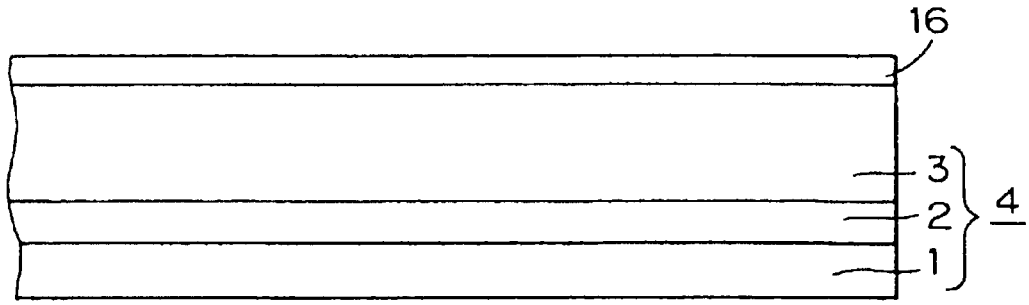
FIGS. 6 to 12 are cross-sectional views illustrating the fabrication process of the semiconductor device according to the present invention.

Referring to FIG. 5 and FIGS. 6 to 12, the $N^+$ layer 2 and the $N^-$ layer 3 are formed on the $P^+$ substrate 1 in this order by the epitaxial growth technique to form the semiconductor body 4 (FIG. 6). When the $N^+$ layer 2 and the $N^-$ layer 3 are thicker than the $P^+$ substrate 1, a $P^+$ layer may be formed on an N substrate by the epitaxial growth technique. Otherwise, a $P^+$ layer and an N layer joined together may be formed on a P or N substrate by diffusion.

Figure 7:
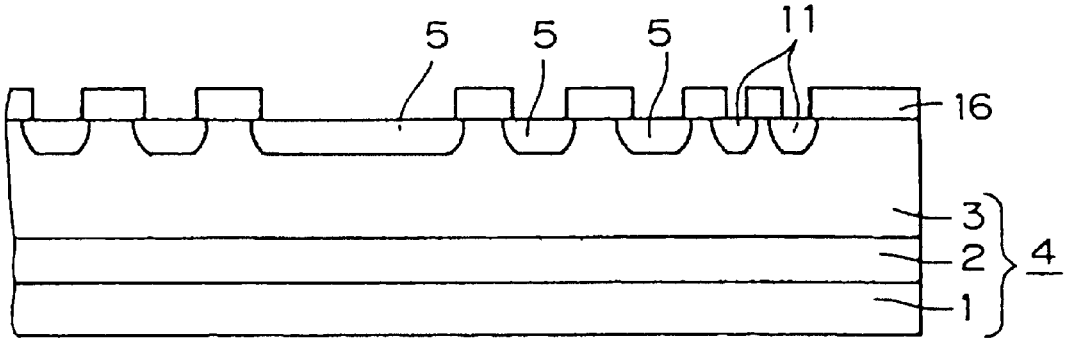

The silicon oxide film 16 is formed on the surface of the semiconductor body 4 and is then etched by photolithography, and the P wells and the $P^+$ base layer 5 are formed by diffusion (FIG. 7).

Figure 8:
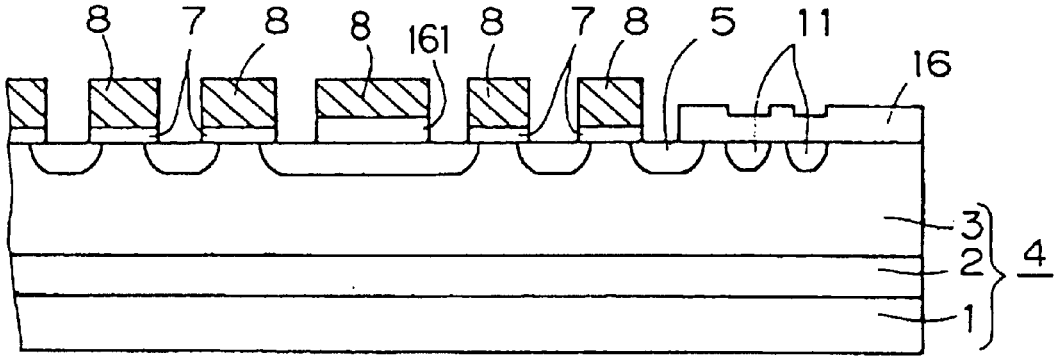

The oxide film 16 is then etched, if necessary, after photolithography process, and the gate insulating film 7 *and silicon oxide film 161* of silicon oxide [is] *are* formed by thermal oxidation. The gate electrode 8 of polysilicon is formed on the surface of the gate insulating film 7 after photolithography process (FIG. 8).

Figure 9:
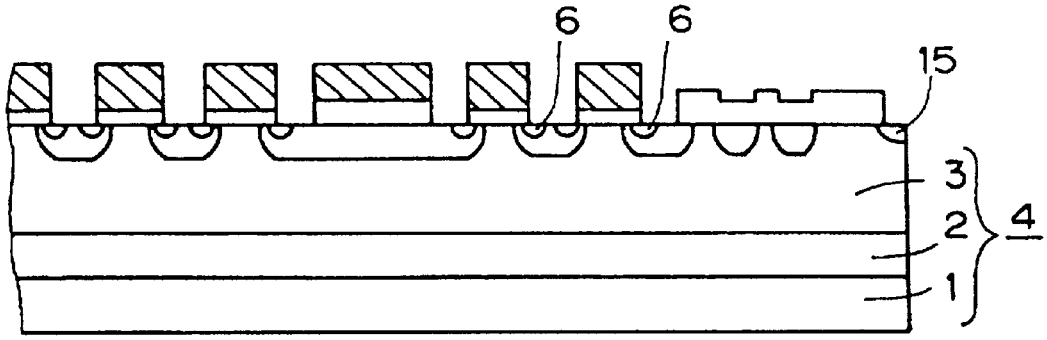

Photolithography process and thermal diffusion process are performed to form the $N^+$ emitter layer 6 in the $P^+$ base region 5 and the channel stopper 15 in the peripheral portion surface of the $N^-$ layer 3 (FIG. 9).

Figure 10:
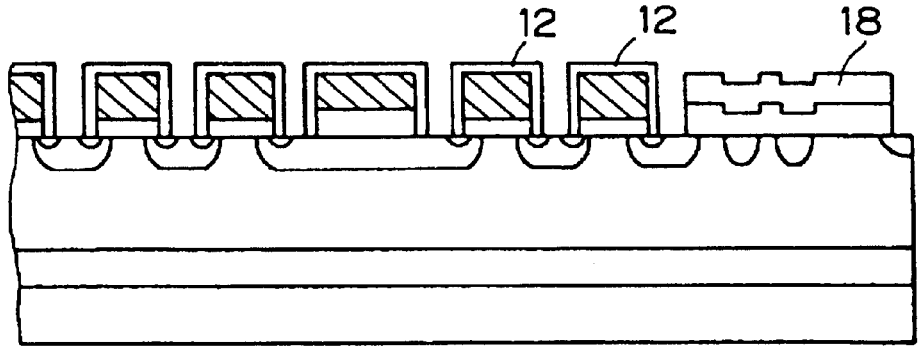

The passivation films [15] *12* and 18 of PSG are formed on the top surface, and electrode contact portions are etched (FIG. 10).

Figure 11:
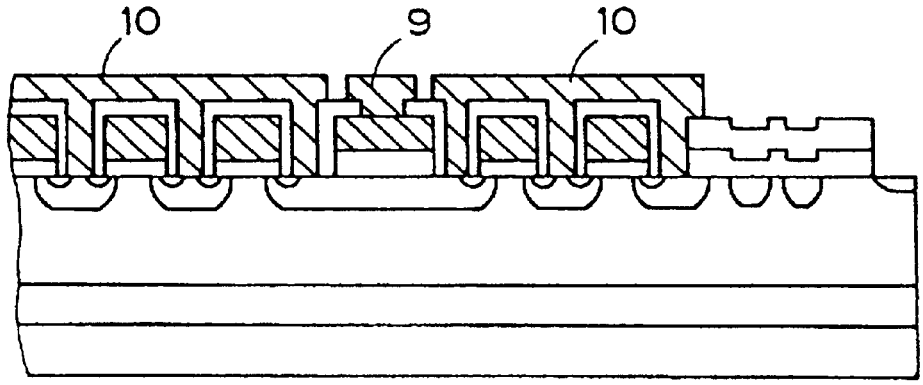

The gate interconnection line 9 and the emitter electrode 10 are formed by Al—Si sputtering (FIG. 11).

For the IGBT, radiation for lifetime control and heat treatment for elimination of distortion generated in portions subjected to the radiation are performed, and the surface protective film 14 is formed on the device top surface. The order of the process steps is the feature of the method of fabricating the IGBT according to the present invention.

Specifically, according to the present invention, the radiation for lifetime control is performed first. Then the heat treatment is performed to eliminate the distortion generated in the portions subjected to the radiation. Finally, the surface protective film 14 is formed on the top surface of the device.

The heat treatment for distortion elimination is performed, for example, at a temperature of about 300 to 400° C. The final P-CVD process in an atmosphere of a mixed silane-ammonia gas is performed at a temperature slightly lower than the heat treatment temperature for distortion elimination. The film may be formed at a temperature of about 300° C. with the current state of the art.

Figure 12:
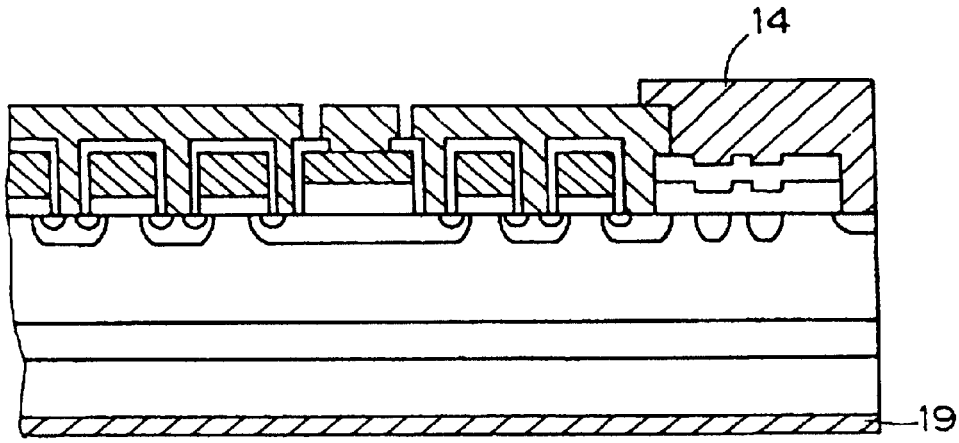

To form the surface protective film 14, a semi-insulation silicon nitride film is formed over the device surface by the P-CVD process, and a mask is formed by photolithography, and then plasma etching is performed in an atmosphere of $CF_4$ and $O_2$ to remove the silicon nitride film in the cell area 31 centrally of the device and in the gate wiring area 32 is removed, with the silicon nitride film left only in the device peripheral area 30. This completes the fabrication process (FIG. 12).

In the above described method, the radiation for lifetime control, the heat treatment for distortion elimination, and the step of leaving the silicon nitride film only in the device peripheral area 30 by the P-CVD process are carried out in this order. Only the arrangement in which the silicon nitride film is left only in the device peripheral area 30 can considerably reduce the variations in threshold voltage $V_{th}$. Thus, the above-described process may be replaced with a process of forming the electrode by Al—Si sputtering (FIG. 11), forming the semi-insulation silicon nitride film only in the device peripheral area 30 by the P-CVD process, performing the radiation for lifetime control, and then performing the heat treatment for distortion elimination.

Such a method can provide an electrically highly stable IGBT with a satisfactory breakdown voltage characteristic by using a conventional fabrication line without a new fabrication line.

A method of fabricating an MOSFET is similar to the method of fabricating the IGBT except that the radiation for lifetime control and the heat treatment for distortion elimination are not performed.

Operation will be described below.

The above stated IGBT according to the present invention includes the semi-insulation silicon nitride film formed by the P-CVD process only in the device peripheral area 30 other than the gate wiring area 32 and cell area 31. Hydrogen atoms to be bonded to dangling bonds at the silicon-silicon oxide interface are contained only in the silicon nitride film in the device peripheral area 30. The hydrogen atoms, if moved, migrate to the silicon-silicon oxide interface under the surface protective film 14, and fewer hydrogen atoms migrate up to the cell area 31. This decreases the number of hydrogen atoms bonded to the dangling bonds at the silicon-silicon oxide interface in the channel regions under the gate electrode 8 in the cell area 31 and, accordingly, reduces the number of Si—H chemical bonds generated at the silicon-silicon oxide interface, to prevent an unstable interface state. Therefore, the phenomenon in which the threshold voltage $V_{th}$ varies over a long time period and requires long time to be saturated is difficult to occur.

Operation of the MOSFET is similar to that of the IGBT when the silicon nitride film is formed only in the device peripheral area 30.

For the IGBT, the radiation for lifetime control and the heat treatment for distortion elimination are essential. If the formation of the silicon nitride film by the P-CVD process after the two process steps increases the number of defects at the silicon-silicon oxide interface due to the radiation to increase the dangling bonds, the subsequent heat treatment reduces the number of defects at the silicon-silicon oxide interface to reduce the number of dangling bonds and, accordingly, the number of Si—H chemical bonds generated at the silicon-silicon oxide interface, preventing the unstable interface state. The influence of the radiation is eliminated, and the acceleration of the $V_{th}$ variations due to the radiation is difficult to occur.

The use of the semi-insulation silicon nitride film as the surface protective film 14 causes a slight current to flow between the emitter and channel stopper to produce an electric field shield effect in the device peripheral area 30. This provides a shield against external impurity ions, to improve the breakdown voltage characteristic of the device. For example, an IGBT having a breakdown voltage as high as 1700 V requires the electric field shield effect using the semi-insulation silicon nitride film.

To simply examine the evaluation of the $V_{th}$ variations for an MIS structure (metal insulator semiconductor structure)

as the premise of the present invention, a C-V test (capacitance-voltage test) was performed under various conditions.

Figure 13:
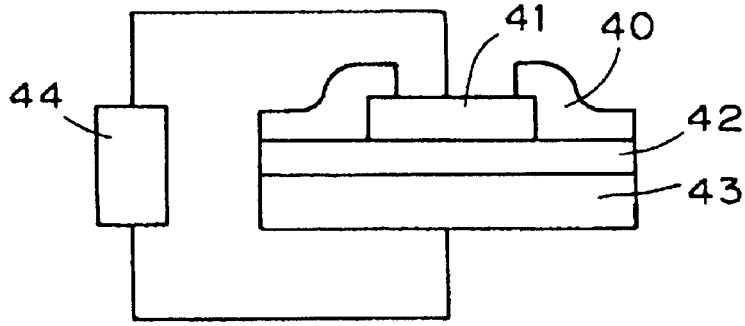
FIG. 13 is a cross-sectional view of a test piece for use in a C-V test.

FIG. 13 is a cross-sectional view of a test piece used for the C-V test.

In FIG. 13, the reference numeral 40 designates a surface protective film; 41 designates an aluminum electrode; 42 designates a thermal oxidation film; 43 designates an N-type silicon layer; and 44 designates a capacitance measuring device.

The C-V test employs the test piece as above described for measuring a voltage and capacitance between the aluminum electrode 41 and the N-type silicon layer 43, with the voltage varied, to determine a flat-band voltage $V_{FB}$ between the thermal oxidation film 42 and the N-type silicon layer 43. There is a correlation between the flat-band voltage $V_{FB}$ and the threshold voltage $V_{th}$. The value of variation $\Delta V_{FB}$ of the flat-band voltage $V_{FB}$ is determined under various conditions such as the presence/absence of the surface protective film 40 of the test piece and processing conditions. On the basis of the value $\Delta V_{FB}$ is evaluated and examined the value of variation $\Delta V_{th}$ of the threshold voltage $V_{th}$ of the surface protective film 14 of a device having an MOS gate.

As the test piece for the C-V test was used a (100) crystal plane oriented N-type silicon on which was formed a silicon thermal oxidation film of about 1000 Å in thickness, with aluminum sputtered on the surface thereof for use as an electrode. After the aluminum electrode 41 was formed, the surface protective film 40 was formed. A P-CVD nitride film containing a large amount of hydrogen atoms and an LP-CVD oxide film containing a small amount of hydrogen atoms were selected as the surface protective film 40. For hydrogen sintering, heat treatment was performed in a high-temperature furnace in an atmosphere of hydrogen at a temperature of 400° C. for 30 minutes. The radiation is an electron beam irradiation which is a conventional IGBT carrier lifetime control process, followed by heat treatment for distortion elimination.

TABLE 1

| spec. | protective film | hydrogen sintering | radiation & heat treatment | $\Delta V_{th}$ (normalization value) | judgement |
|---|---|---|---|---|---|
| A | no film | not done | not done | 0.10 | ○ |
| B | LP-CVD oxide film | not done | not done | 0.10 | ○ |
| C | P-CVD nitride film | not done | not done | 0.50 | Δ |
| D | no film | done | not done | 0.45 | Δ |
| E | LP-CVD oxide film | not done | done | 0.10 | ○ |
| F | P-CVD nitride film | not done | done | 1.00 | x |
| G | no film | done | done | 0.90 | x |
| H | hydrogen sintering after radiation & heat treatment | | | 0.10 | ○ |

Table 1 illustrates the conditions and results of the C-V test.

Additional explanation of Table 1 will be described below.

(1) To determine the value of variation $\Delta V_{th}$, the flat-band voltage $V_{FB}$ was first determined, and then the test piece was held at 150° C., and a 30 V d.c. bias voltage was applied for 5 minutes, with the aluminum electrode 41 being negative. The flat-band voltage $V_{FB}$ was measured again to calculate the difference $\Delta V_{FB}$ between the first and second $V_{FB}$ measurements.

(2) The LP-CVD oxide film in spec. B was a PSG film formed by the LP-CVD process.

(3) The P-CVD nitride film in spec. C was a semi-insulation film containing a large amount of silicon.

(4) The radiation and heat treatment were performed after the protective film was formed in specs. E and F.

(5) The radiation and heat treatment were performed after the hydrogen sintering in spec. G.

(6) No protective film was formed in spec. H.

(7) $\Delta V_{FB}$ (normalization value) was a ratio of $\Delta V_{FB}$ in each spec. to $\Delta V_{FB}$ in spec. F.

Figure 14:
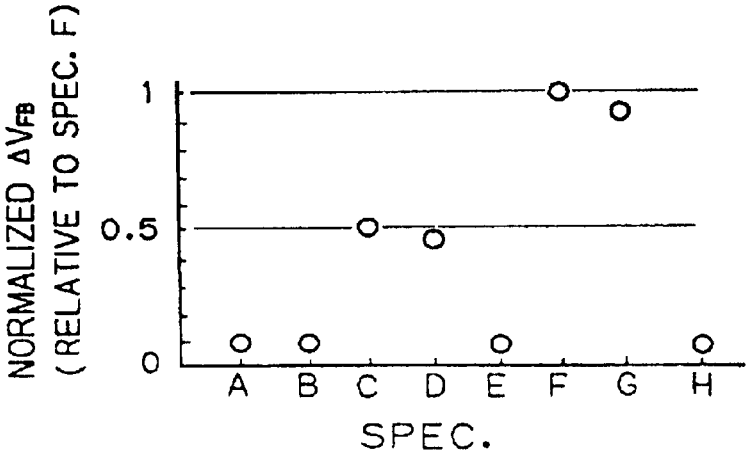
FIG. 14 is a graph illustrating $\Delta V_{FB}$ (normalization value) for the C-V test.

FIG. 14 is a graph illustrating $\Delta V_{FB}$ (normalization value) for the C-V test of Table 1.

Referring to FIG. 14, $\Delta V_{FB}$ (normalization value) is low in specs. A, B and E with few hydrogen atoms and is high in specs. C and D with a large amount of hydrogen atoms. The radiation after the formation of the protective film further increases $\Delta V_{FB}$ (normalization value). It will be apparent from the graph of FIG. 14 that:

(1) $V_{FB}$ is varied by introduction of hydrogen atoms into the MIS structure (specs. C and D), (2) $V_{FB}$ is varied more widely by the radiation in addition to the introduction of hydrogen atoms (specs. F and G), (3) $V_{FB}$ is not varied by the radiation only (spec. E), and (4) $V_{FB}$ is not varied by the introduction of hydrogen atoms after the radiation and the heat treatment (spec. H).

Therefore, it will be understood that:

(i) it is necessary to prevent hydrogen atoms from entering the cell area 31 having the channels in the MIS structure or the device having the MOS gate, (ii) it is also necessary to prevent hydrogen atoms from entering the cell area 31, particularly in the IGBT performing lifetime control, and (iii) the introduction of hydrogen atoms after the radiation and heat treatment exerts no influence on the $V_{FB}$ variations in the IGBT performing lifetime control. An electrically highly stable IGBT with a satisfactory breakdown voltage characteristic is accomplished by the provision of the surface protective film 14 which is the semi-insulation silicon nitride film formed by the P-CVD process only in the device peripheral area 30 like the first preferred embodiment and by the process steps of performing radiation for lifetime control, performing heat treatment for distortion elimination, and then forming the surface protective film 14 on the device top surface.

An electrically highly stable MOSFET with a satisfactory breakdown voltage characteristic is accomplished by the provision of the surface protective film 14 which is the semi-insulation silicon nitride film formed by the P-CVD process only in the device peripheral area 30 other than the gate wiring area 32 and the cell area 31.

Figure 15:
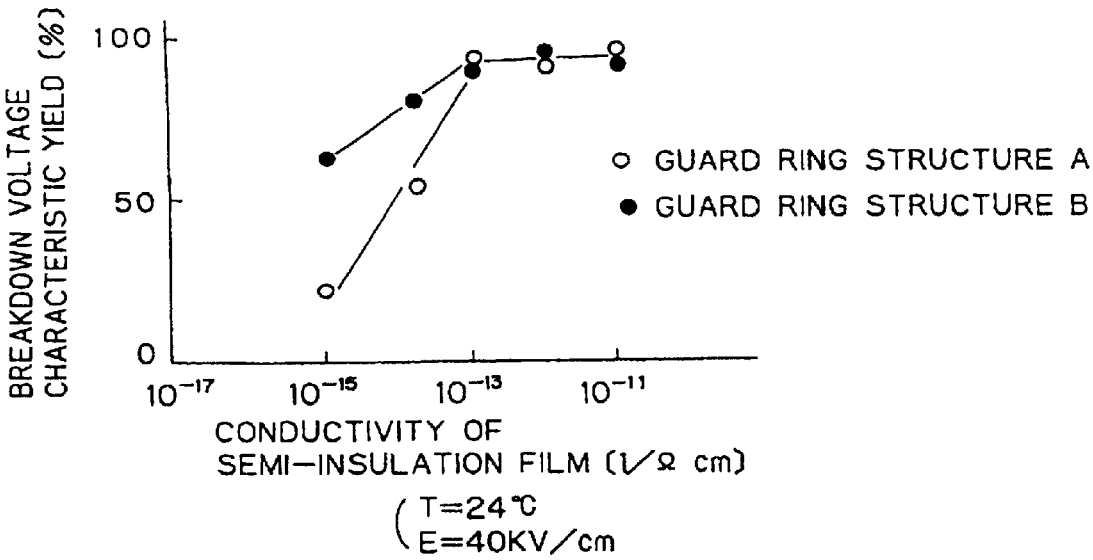
FIG. 15 is a graph illustrating a breakdown voltage characteristic yield of the semiconductor device according to the present invention.

FIG. 15 is a graph illustrating a breakdown voltage characteristic yield of the structure of the first preferred embodiment.

Referring to FIG. 15, the guard ring structure A includes eight guard rings 11 surrounding the outer periphery of the cell area 31, and the guard ring structure B includes ten guard rings 11 such that a distance between the outermost guard ring 11 and the channel stopper 15 is 1.3 times the distance therebetween of the guard ring structure A.

It will be appreciated from the graph of FIG. 15 that there is a difference in breakdown voltage characteristic yield between the guard ring structure A and the guard ring structure B when the conductivity of the surface protective film 14 is less than $1\times10^{-13}/\Omega$cm, but there is no difference in breakdown voltage characteristic yield therebetween with the increasing breakdown voltage characteristic yield when the conductivity is not less than $1\times10^{-13}/\Omega$cm. This indicates not only the improvement in breakdown voltage characteristic by the electric field shield effect but also that the device breakdown voltage characteristic is stabilized by the use of the semi-insulation surface protective film 14 with the conductivity of not less than $1\times10^{-13}$ /Ωcm. This increases the degree of freedom to determine the guard ring structure dimension and the degree of freedom of design, for example, the stable breakdown voltage characteristic independent of variations in fabrication process of the guard ring structure. However, an excessively high conductivity eliminates the function of the insulating film. Thus, the conductivity of the surface protective film 14 is required to be on the order of $1\times10^{-14}$ to $1\times10^{-10}$ (1/Ωcm) and is preferably $1\times10^{-13}$ to $1\times10^{-11}$ (1/Ωcm) which permits easy control of the conductivity of the semi-insulation silicon nitride film by measuring the refractive index of the film.

Second Preferred Embodiment

Figure 16:
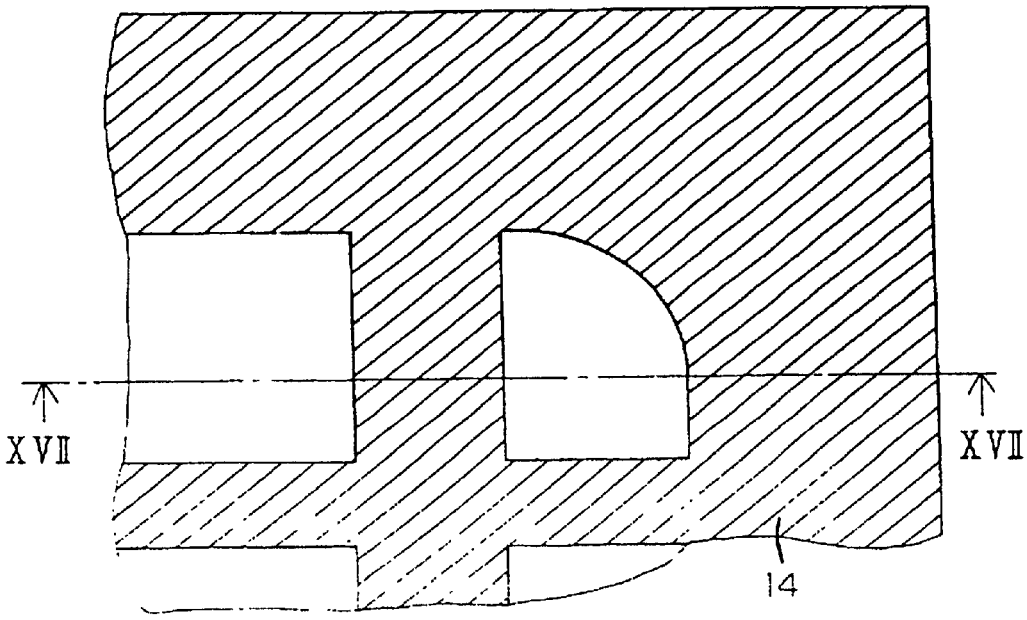
FIG. 16 is a fragmentary plan view of the semiconductor device according to a second preferred embodiment of the present invention.
Figure 17:
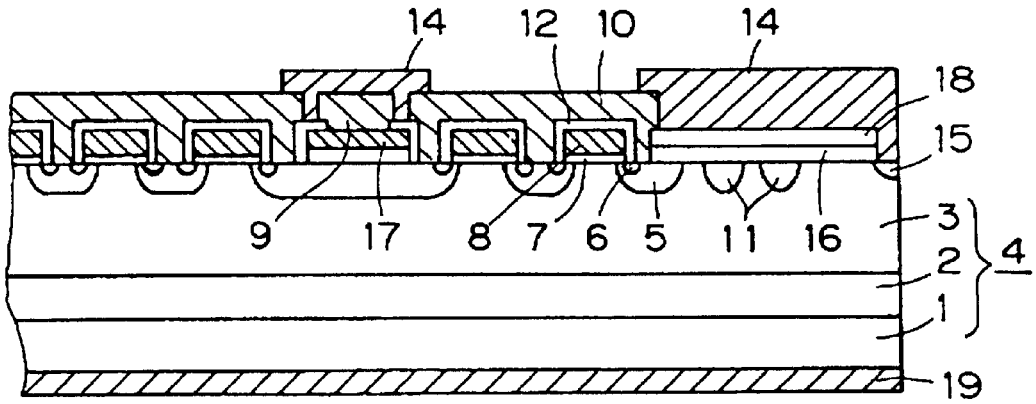
FIG. 17 is a fragmentary cross-sectional view taken along the line XVII—XVII of FIG. 16.

FIG. 16 is a fragmentary plan view of the IGBT according to a second preferred embodiment of the present invention. FIG. 17 is a fragmentary cross-sectional view taken along the line XVII—XVII of FIG. 16.

Referring to FIGS. 16 and 17, the IGBT comprises the surface protective film 14 formed in the gate wiring area 32 and the device peripheral area 30.

The emitter electrode 10 is electrically isolated from the gate interconnection line 9 by a narrow trench. The emitter electrode 10 and the gate interconnection line 9 which are Al—Si sputtering film are easily scratched, for example, when the semiconductor device is handled by a handling device during the fabrication process, resulting in shorting of the emitter electrode 10 and the gate interconnection line 9. However, such a failure is prevented by the surface protective film 14 extending to the surface of the narrow trench. In addition, since there is no channel regions serving as cells under the gate wiring area 32, the covering of the semi-insulation surface protective film 14 of silicon nitride formed by the P-CVD process and containing a large amount of hydrogen atoms does not cause the $V_{th}$ variations. Therefore, an electrically highly stable IGBT is accomplished, with shorting of the emitter electrode 10 and the gate interconnection line 9 being prevented, like the first preferred embodiment.

Further, an electrically highly stable MOSFET is accomplished, with shorting of the emitter electrode 10 and the gate interconnection line 9 being prevented, like the first preferred embodiment by the provision of the surface protective film 14 in the gate wiring area 32 and the device peripheral area 30 of the MOSFET.

Third Preferred Embodiment

Figure 19:
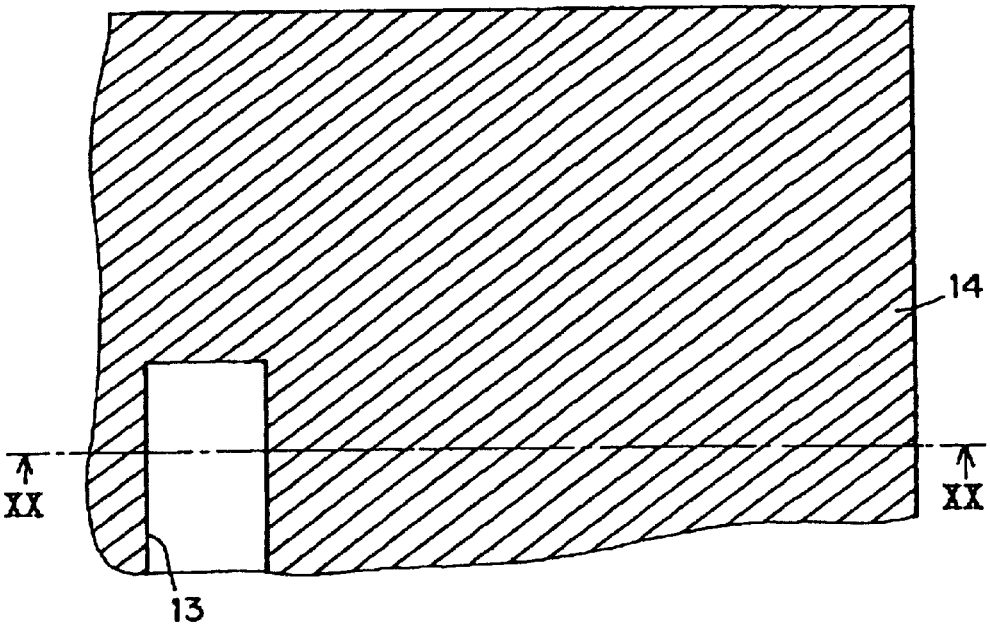
FIG. 19 BACKGROUND ART
FIG. 19 is a fragmentary plan view of a conventional semiconductor device.
Figure 20:
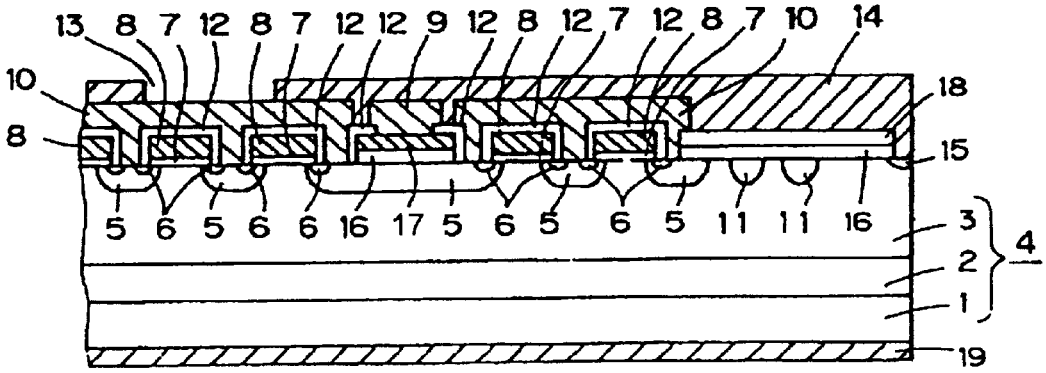
FIG. 20 BACKGROUND ART
FIG. 20 is a cross-sectional view taken along the line XX—XX of FIG. 19.
Figure 21:
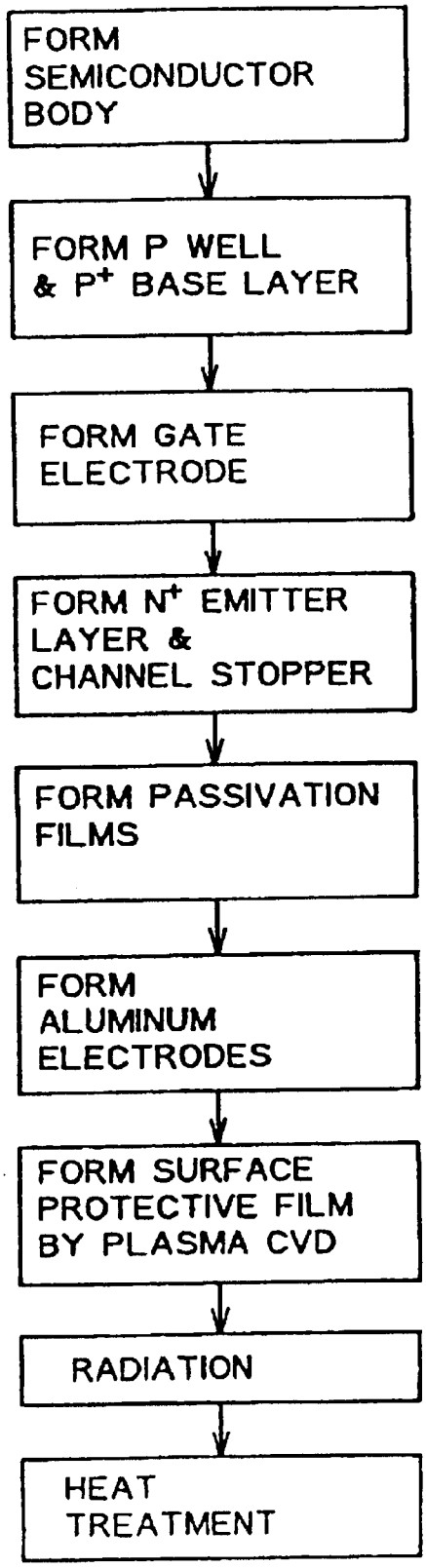
FIG. 21 BACKGROUND ART
FIG. 21 is a flow chart of fabrication process of the conventional semiconductor device.
Figure 22:
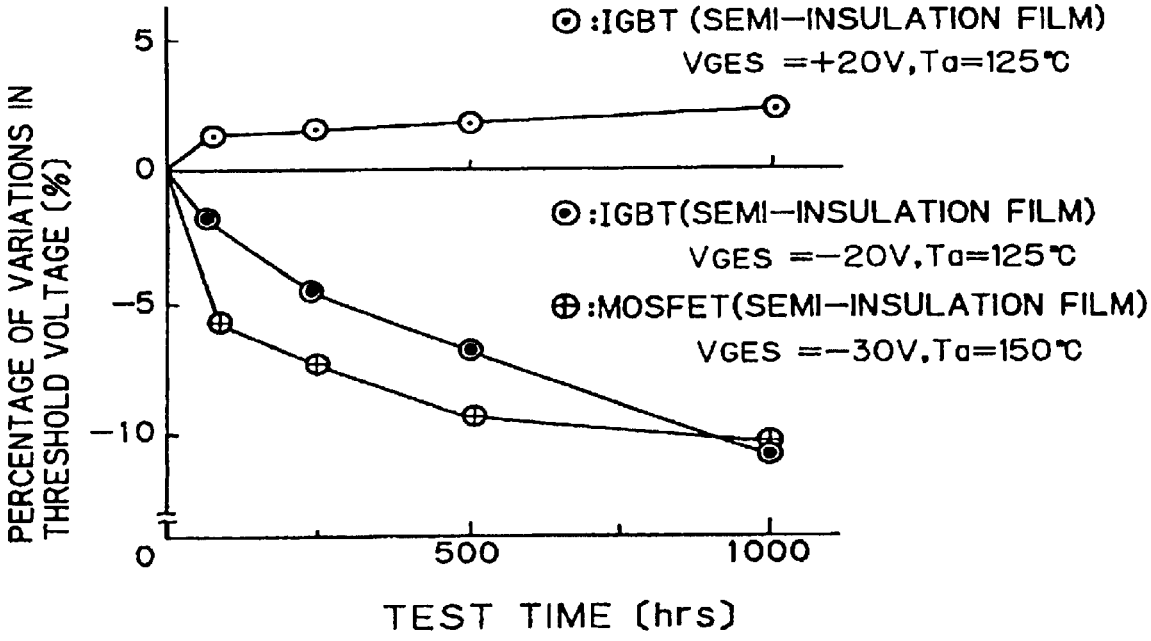
FIG. 22 BACKGROUND ART
FIG. 22 is a graph of an HTGB test result for the conventional semiconductor device.

The third preferred embodiment according to the present invention includes an IGBT device structure identical with the conventional structure of FIG. 19 but fabricated by the process corresponding to that of FIG. 5 and FIGS. 6 to 12.

Specifically, the third preferred embodiment is similar to the first preferred embodiment in the process steps between the formation of the semiconductor body 4 (FIG. 6) and the electrode formation by Al—Si sputtering (FIG. 11). Then radiation is performed for lifetime control, and heat treatment is performed to eliminate distortion, and the surface protective film 14 is finally formed on the device top surface.

The surface protective film 14 on the device top surface is a semi-insulation silicon nitride film formed by the P-CVD process to cover the IGBT surface except the emitter wire bonding region 13, the gate interconnection line, and the gate bonding pad which is a part of the gate interconnection line.

As concluded from the C-V test result that (iii) the introduction of hydrogen atoms is permitted after the radiation for lifetime control and heat treatment for distortion elimination in the IGBT performing lifetime control, the use of the fabrication method of the third preferred embodiment allows defects generated due to the radiation to be reduced by the heat treatment to reduce the number of dangling bonds at the silicon-silicon oxide interface. The Si—H chemical bonds becomes difficult to generate at the silicon-silicon oxide interface.

For this reason, if the P-CVD nitride film containing a large amount of hydrogen atoms is provided in the cell area 31, the number of Si—H chemical bonds is reduced at the silicon-silicon oxide interface in the cell area 31, providing a stable interface state. Thus, there is provided an electrically highly stable IGBT of the conventional construction with a small amount of long-term $V_{th}$ variations, wherein shorting of the emitter electrode 10 and gate interconnection line 9 is prevented, like the first preferred embodiment.

Figure 18:
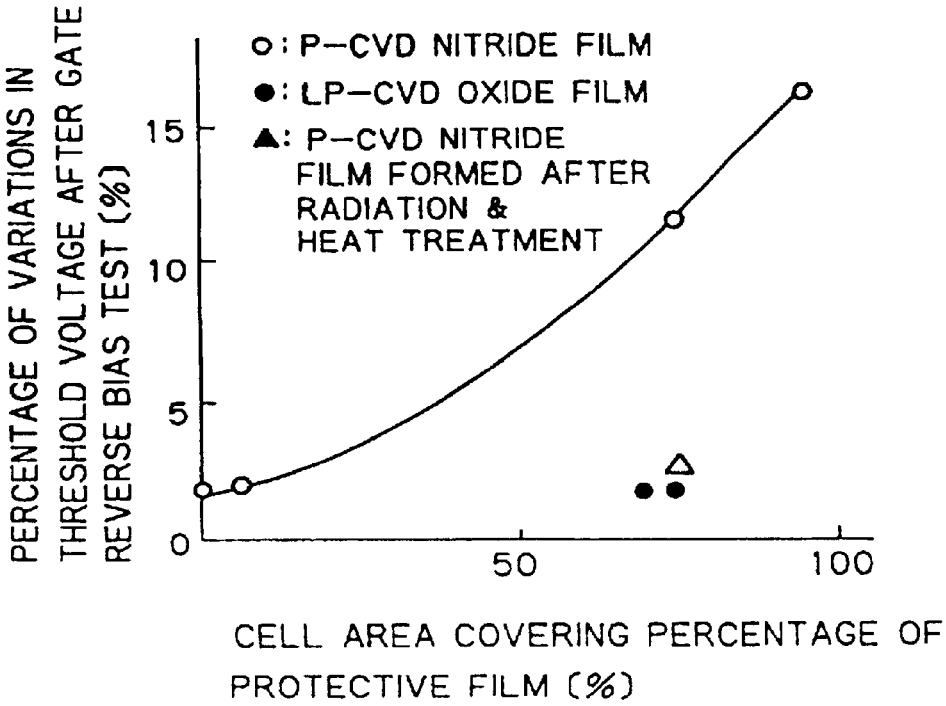
FIG. 18 is a graph for comparison between a threshold voltage $V_{th}$ variation percentage of the present invention and a threshold voltage $V_{th}$ variation percentage of the background art.

FIG. 18 is a graph for comparison of the percentage of variations in threshold voltage $V_{th}$ between the present invention and the background art.

Referring to FIG. 18, the percentage of variations in threshold voltage after a reverse bias test is a little over 15% and a little over 10% for the IGBT of the conventional construction having the protective film covering 90% and 70% of the cell area, respectively. The percentage of variations in threshold voltage after the reverse bias test is about 2% for the IGBT of the first preferred embodiment of the present invention having the protective film covering 0% of the cell area, and the percentage is about 2% for the IGBT of the second preferred embodiment of the present invention having the protective film covering 10% of the cell area. The first and second preferred embodiments provide the percentage generally equal to the percentage of variations in threshold voltage for the conventional IGBT having the PSG film containing a small amount of hydrogen atoms and formed by the LP-CVD process. For the IGBT of the third preferred embodiment having the protective film covering 75% of the cell area and fabricated by the process of performing radiation, performing heat treatment for distortion elimination, and then forming the silicon nitride surface protective film by the P-CVD process, the percentage of variations in threshold voltage is a little higher than but generally equal to the percentages of the first and second preferred embodiments.

In this manner, the first, second and third preferred embodiments achieve the electrically highly stable semiconductor device with the MOS gate having a satisfactory breakdown voltage characteristic.

The above-mentioned preferred embodiments describe the power semiconductor device having the MOS gate. However, the present invention is also applicable to semiconductor integrated circuit devices, such as memories, having an MOS gate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a first semiconductor layer *having a first doping state* of a first conductivity type *and* having first and second major surfaces;

a first semiconductor region of a second conductivity type formed selectively in said first major surface of said first semiconductor layer so that said first semiconductor layer [is exposed in] *remains in the first doping state along* a peripheral portion of said first major surface, and said first semiconductor layer [is exposed in] *remains in the first doping state* in [the] *a* form of an insular region *in a planar view* in a central portion of said first major surface;

a second semiconductor region of the first conductivity type formed in a surface of said first semiconductor region, with a channel region provided between said second semiconductor region and said insular region of said first semiconductor layer;

a gate insulating film formed on a surface of said channel region;

a first gate *electrode from a plurality of gate electrodes* formed on said gate insulating film;

an interlayer insulating film formed at least on said first gate *electrode*;

a first main electrode formed over a surface of said interlayer insulating film and covering a surface of said second semiconductor region, said first main electrode being electrically connected to said second semiconductor region and having an end extending to a boundary between the peripheral portion of said first major surface and the central portion of said first major surface;

a second main electrode formed on said second major surface of said first semiconductor layer; and an integral semi-insulating plasma CVD nitride film covering at least the peripheral portion of said first major surface other than the central portion of said first major surface and not extending [to an upper portion of said first gate] *above any gate electrode*, said integral semi-insulating plasma CVD nitride film having a conductivity which does not lose function as an insulating film and stabilizes breakdown voltage characteristics of the semiconductor device.

2. The semiconductor device of claim 1, wherein said plasma CVD nitride film extends from the peripheral portion of said first major surface to a surface of said first main electrode at said end.

3. The semiconductor device of claim 1, further comprising:

a second gate *electrode from the plurality of gate electrodes* not covered with said first [gate] *main electrode*; and a gate interconnection line formed selectively on a surface of said second gate *electrode*, wherein a trench is formed between said first main electrode and said gate interconnection line for electrical isolation between said first main electrode and said gate interconnect line, and wherein said first gate *electrode* and said second gate *electrode* are *integrally formed and* electrically connected [by said gate interconnection line] *to each other*.

4. The semiconductor device of claim 3, wherein said plasma CVD nitride film further extends from a surface of said gate interconnection line through said trench to a portion of a surface of said first main electrode.

5. The semiconductor device of claim 4, wherein said plasma CVD nitride film is a semi-insulation film having a conductivity ranging from $1\times10^{-14}$ to $1\times10^{-10}$ (1/Ωcm).

6. The semiconductor device of claim 4, wherein said plasma CVD nitride film is a semi-insulation film having a conductivity ranging from $1\times10^{-13}$ to $1\times10^{-11}$ (1/Ωcm).

7. The semiconductor device of claim 1, further comprising:

a second semiconductor layer of the second conductivity type formed between said second major surface of said first semiconductor layer and said second main electrode.

8. The semiconductor device of claim 7, further comprising:

a second gate *electrode from the plurality of gate electrodes* not covered with said first main electrode; *and*

*a gate interconnection line formed selectively on a surface of said second gate electrode,* wherein a trench is formed between said first main electrode and said gate interconnection line for electrical isolation between said first main electrode and said gate interconnect line, and wherein said first gate electrode and said second gate electrode are *integrally formed and* electrically connected [by said gate interconnection line] *to each other*.

9. The semiconductor device of claim 8, wherein said [surface protective film] *plasma CVD nitride film* further extends from a surface of said gate interconnection line through said trench to a portion of a surface of said first main electrode.

10. The semiconductor device of claim 9, wherein said plasma CVD nitride film is a semi-insulation film having a conductivity ranging from $1\times10^{-14}$ to $1\times10^{-10}$ (1/Ωcm).

11. The semiconductor device of claim 9, wherein said plasma CVD nitride film is a semi-insulation film having a conductivity ranging from $1\times10^{-13}$ to $1\times10^{-11}$ (1/Ωcm).

12. A semiconductor device comprising:

a first semiconductor layer *having a first doping state* of a first conductivity type *and* having first and second major surfaces;

at least one first semiconductor region of a second conductivity type formed selectively in said first major surface of said first semiconductor layer so that said first semiconductor [layer is exposed in] *remains in the first doping state along* a peripheral portion of said first major surface, and said first semiconductor [layer is exposed in] *region remains in the first doping state* in [the] *a* form of a plurality of insular regions *in a planar view* in a central portion of said first major surface;

a plurality of second semiconductor regions of the first conductivity type formed in a surface of said at least one first semiconductor region, with channel regions provided between said second semiconductor regions and said insular regions of said first semiconductor layer;

a gate insulating film formed on a surface of said channel regions;

a first gate *electrode from a plurality of gate electrodes* formed on said gate insulating film;

an interlayer insulating film formed at least on said first gate *electrode*;

a first main electrode formed over a surface of said interlayer insulating film and covering a surface of said second semiconductor region, said first main electrode being electrically connected to said plurality of second semiconductor regions, said first main electrode further having an end extending to a boundary between the peripheral portion of said first major surface and the central portion of said first major surface;

a second main electrode formed on said second major surface of said first semiconductor layer; and an integral semi-insulating plasma CVD nitride film for covering at least the peripheral portion of said first major surface other than the central portion of said first major surface and not extending [to an upper portion of said first gate] *above any gate electrode*, said integral semi-insulating plasma CVD nitride film having a conductivity which does not lose function as an insulating film and stabilizes breakdown voltage characteristics of the semiconductor device.

13. The semiconductor device of claim 12, wherein said plasma CVD nitride film extends from the peripheral portion of said first major surface to a surface of said first main electrode at said end.

14. The semiconductor device of claim 13, further comprising:

a second gate *electrode from the plurality of gate electrodes* not covered with said first main electrode; and a gate interconnection line formed selectively on a surface of said second gate *electrode*, wherein a trench is formed between said first main electrode and said gate interconnection line for electrical isolation between said first main electrode and said gate interconnect line, and wherein said first gate *electrode* and said second gate *electrode* are *integrally formed and* electrically connected [by said gate interconnection line] *to each other*.

15. The semiconductor device of claim 14, wherein said plasma CVD nitride film further extends from a surface of said gate interconnection line through said trench to a portion of a surface of said first main electrode.

16. The semiconductor device of claim 15, wherein said plasma CVD nitride film is a semi-insulation film having a conductivity ranging from $1\times10^{-14}$ to $1\times10^{-10}$ (1/Ωcm).

17. The semiconductor device of claim 15, wherein said plasma CVD nitride film is a semi-insulation film having a conductivity ranging from $1\times10^{-13}$ to $1\times10^{-11}$ (1/Ωcm).

18. The semiconductor device of claim 13, further comprising:

a second semiconductor layer of the second conductivity type formed between said second major surface of said first semiconductor layer and said second main electrode.

19. The semiconductor device of claim 18, further comprising:

a second gate *electrode from the plurality of gate electrodes* not covered with said first main electrode; and a gate interconnection line formed selectively on a surface of said second gate *electrode*, wherein a trench is formed between said first main electrode and said gate interconnection line for electrical isolation between said first main electrode and said gate interconnect line, and wherein said first gate *electrode* and said second gate *electrode* are *integrally formed and* electrically connected [by said gate interconnection line] *to each other*.

20. The semiconductor device of claim 19, wherein said plasma CVD nitride film further extends from a surface of said gate interconnection line through said trench to a portion of a surface of said first main electrode.

21. The semiconductor device of claim 20, wherein said plasma CVD nitride film is a semi-insulation film having a conductivity ranging from $1\times10^{-14}$ to $1\times10^{-10}$ (1/Ωcm).

22. The semiconductor device of claim 20, wherein said plasma CVD nitride film is a semi-insulation film having a conductivity ranging from $1\times10^{-13}$ to $1\times10^{-11}$ (1/Ωcm).

* * * * *